United States Patent
Graham et al.

(10) Patent No.: US 7,385,243 B2
(45) Date of Patent: Jun. 10, 2008

(54) FLOATING GATE MEMORY CELL WITH A METALLIC SOURCE/DRAIN AND GATE, AND METHOD FOR MANUFACTURING SUCH A FLOATING GATE MEMORY GATE CELL

(75) Inventors: Andrew Graham, Munich (DE); Franz Hofmann, Munich (DE); Michael Specht, Munich (DE)

(73) Assignee: Infineon Technologies AG (DE)

( * ) Notice: Subject to any disclaimer, the term of this patent is extended or adjusted under 35 U.S.C. 154(b) by 44 days.

(21) Appl. No.: 10/926,838

(22) Filed: Aug. 25, 2004

(65) Prior Publication Data

US 2005/0048720 A1 Mar. 3, 2005

Related U.S. Application Data

(63) Continuation of application No. PCT/DE03/00406, filed on Feb. 12, 2003.

(30) Foreign Application Priority Data

Feb. 25, 2002 (DE) .................................. 102 07 980

(51) Int. Cl.
*H01L 29/30* (2006.01)
(52) U.S. Cl. ..................... 257/314; 257/315; 257/E29.3
(58) Field of Classification Search ................ 257/314, 257/315, E29.3
See application file for complete search history.

(56) References Cited

U.S. PATENT DOCUMENTS

| 5,998,264 | A | 12/1999 | Wu |
| 6,023,079 | A | 2/2000 | Hida |
| 6,175,394 | B1 * | 1/2001 | Wu et al. ..................... 349/40 |
| 6,509,217 | B1 * | 1/2003 | Reddy .......................... 438/153 |

FOREIGN PATENT DOCUMENTS

| JP | 64-037872 A | 2/1989 |
| JP | 9-27561 A | 1/1997 |
| JP | 9-213822 A | 8/1997 |
| JP | 11-340344 A | 12/1999 |
| JP | 2003-060170 A | 2/2003 |

OTHER PUBLICATIONS http://www.ee.byu.edu/cleanroom/ohmic-schottky.phtml.*
D. Widmann et al.: "Technologie hochintegrierter Schaltungen", Chapter 8.4, Springer Verlag, Berlin, ISBN 3-540-59357-8 (1996).
K. Fujimaru et al.: "Theoretical Consideration of a New Nanometer Transistor Using Metal/Insulator Tunnel-Junction"; Jpn. J. Appl. Phys. vol. 35 (1996), pp. 2090-2094.

(Continued)

*Primary Examiner*—Bradley K Smith
(74) *Attorney, Agent, or Firm*—Dickstein, Shapiro, LLP.

(57) ABSTRACT

Floating gate memory cell having a first layer with first and second source/drain regions and a channel region arranged between and next to the first and second source/drain regions, and a floating gate layer arranged on the first layer, wherein the first and second source/drain regions and the floating gate layer are formed of a metallically conductive material, and the channel region is formed of an electrically insulating material.

24 Claims, 3 Drawing Sheets

OTHER PUBLICATIONS

K. Fukushima et al.: "A Novel Nanoscale Metal Transistor Fabricated by Conventional Photolithography"; Jpn. J. Appl. Phys. vol. 38 (1999), p. 7233-7236.

K. Fujimaru et al.: "A New Nano-Scale Transistor Using Metal/Insulator/Metal Tunnel Junction"; 56th Annual Device Research Conference Digest (CAT. No. 98th8373), Charlottesville, VA, USA, Jun. 22-24, 1998, pp. 44-45, ISBN: 0-7803-4995-4.

S.M. Sze: 1985, Semiconductor Devices, Murray Hill, XP002244061, ISBN: 0-471-87424-8, p. 487-490, Figure 21A.

K. Fukushima et al.: "A Novel Nanoscale Metal Transistor Fabricated By Conventional Photolithography"; Digest of Papers, Microprocesses and Nanotechnology '99, 1999 International Microprocesses and Nanotechnology Conference, Yokoha, pp. 88-89, XP002244060, 1999, Tokyo, Japan, Japan Society of Applied Physics, Japan, ISBN: 4-930813-97-2.

K. Fujimaru, et al.; "Nanoscale metal transistor control of Fowler-Nordheim tunneling currents through 16nm insulating channel"; School of Materials Science, JAIST (Japan Advanced Institute of Science and Technology), Tatsunokuchi, Ishikawa-ken, 923-1292, Japan. (English abstract only).

* cited by examiner

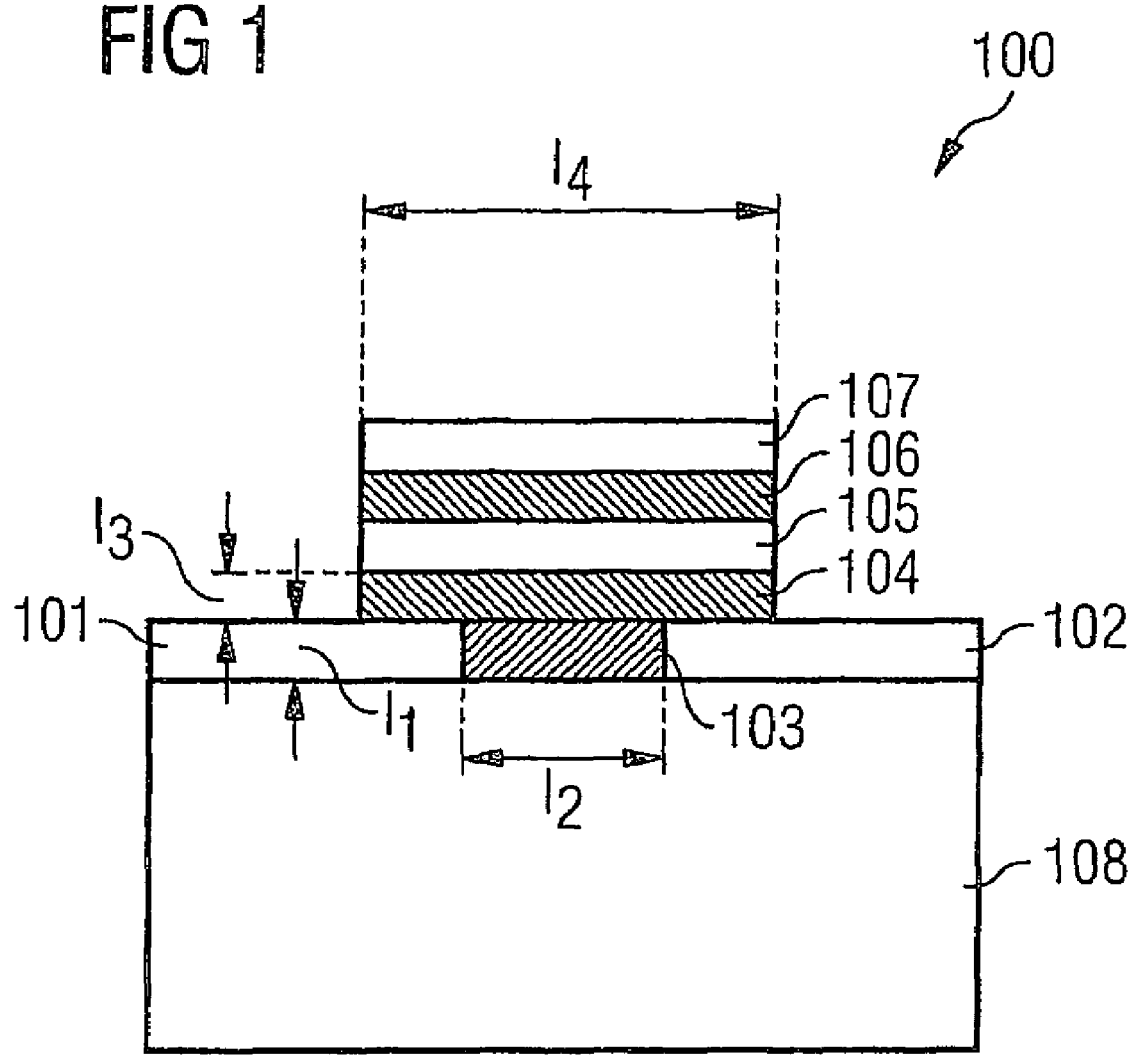

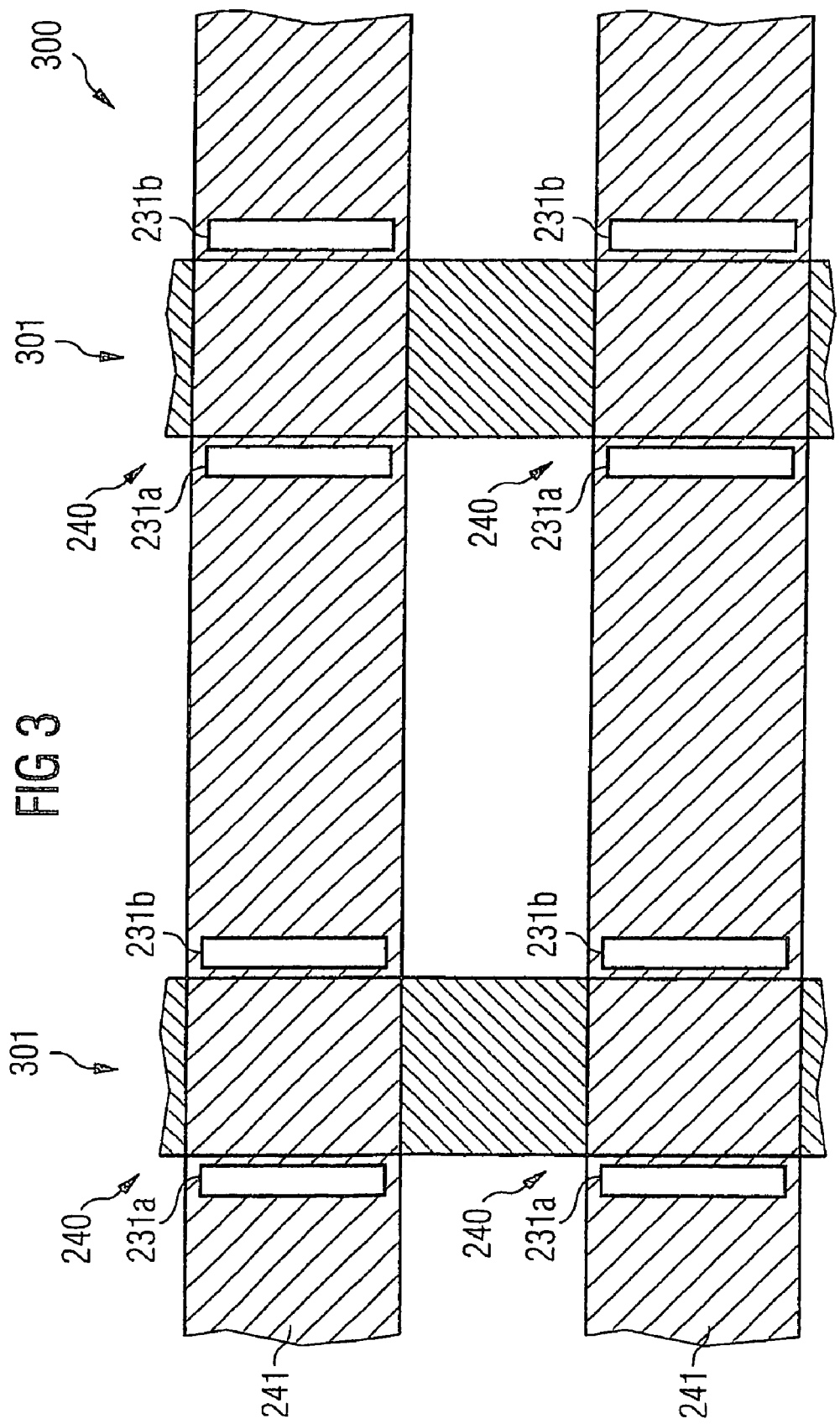

FLOATING GATE MEMORY CELL WITH A METALLIC SOURCE/DRAIN AND GATE, AND METHOD FOR MANUFACTURING SUCH A FLOATING GATE MEMORY GATE CELL

CROSS-REFERENCE TO RELATED APPLICATION

This application is a continuation of International Patent Application Serial No. PCT/DE03/00406, filed Feb. 12, 2003, which published in German on Sep. 4, 2003 as WO 03/073499, and is incorporated herein by reference in its entirety.

FIELD OF THE INVENTION

The invention relates to a floating gate memory cell, to a floating gate memory arrangement, to a circuit arrangement and to a method for fabricating a floating gate memory cell.

BACKGROUND OF THE INVENTION

In view of the rapid developments being made in computer technology, there is a demand for ever faster and denser storage media. Among semiconductor memories, a distinction is drawn between different concepts. In the case of dynamic RAMs (Dynamic Random Access Memories), the information is stored in a storage capacitor, but this capacitor loses its charge over the course of time and therefore has to be regularly refreshed. Although DRAM memories have sufficiently fast access times, a stored item of information is lost on disconnection from the voltage source.

By contrast, the memory contents of a static RAM, SRAM (Static Random Access Memory), do not have to be constantly refreshed. However, should the supply voltage fail, the memory contents of a static RAM are lost. Although static RAM memories have short access times, the structure of a static RAM is complex and requires a relatively large number of components. Therefore, the storage densities that can be achieved with static RAMs are too low for some applications.

A non-volatile memory is distinguished by the fact that the information stored in a memory cell of this type is retained for a sufficiently long retention time (a retention time in the range of years is typically required) after a supply voltage has been switched off. A non-volatile semiconductor memory which is often used is the EEPROM (Electrically Erasable and Programmable Read Only Memory).

One important example of an EEPROM is what is known as the floating gate memory. In a floating gate memory which is known from the prior art, an electric charge is stored in a polysilicon structure, the floating gate, which is electrically decoupled from its surroundings. The floating gate is charged and discharged by means of electrical charge carriers which tunnel through a thin insulation layer between the semiconductor and the floating gate. A floating gate memory is programmed by an $n^+$-doped silicon region below the thin insulation layer being brought to a sufficiently high electrical potential, so that the electrical field strength in the thin insulation layer comes close to the breakdown field strength. As a consequence, electrical charge carriers tunnel between the floating gate and the $n^+$-doped silicon region beneath it. As a result, an uncompensated electrical charge remains in the floating gate, where it stays for a sufficiently long retention time even in a state in which electric voltages are no longer being applied to the floating gate memory. In the event of a read operation, the memory transistor, on account of the electrically charged floating gate, has a better electrical conductivity than with an electrically uncharged floating gate, with the information item, which is preferably binary, to be stored being coded in the value for the electrical conductivity of the memory transistor.

However, flash EEPROM cells which are known from the prior art have the drawback that the write and erase times are in the range between approximately one millisecond and approximately ten microseconds. Therefore, the write and erase times of flash memories are considerably slower than the write and erase memories of DRAM memories. By way of example, Widmann, D, Mader, H, Friedrich, H (1996) "Technologie hochintegrierter Schaltungen" [Technology of large scale integrated circuits], Chapter 8.4, Springer Verlag, Berlin, ISBN 3 540 59357 8, provides an overview of the technology of semiconductor memories.

Hitherto, high-density non-volatile memory cells have only been based on silicon. The area taken up by the known non-volatile semiconductor memory cell is in the range from 5 $F^2$ to 8 $F^2$, where F is the minimum feature size in one dimension which can be achieved within a technology generation.

It is known from Fujimaru, K, Matsumura, H (1996) "Theoretical Consideration of a New Nanometer Transistor Using Metal/Insulator Tunnel Junction" Jpn.J.Appl.Phys. Vol. 35, pp. 2090 2094, to form a transistor on a nanometer scale using a metal-insulator tunnel junction. In accordance with the transistor which is known from Fujimaru et al., an electrical metal-insulator-metal tunneling current is controlled by application of an electric voltage to a gate electrode, the gate electrode being arranged above the insulator. According to a computer simulation described in Fujimaru et al., the device described has a similar functionality to a conventional silicon transistor.

Furthermore, Fukushima, K, Sasajima, R, Fujimaru, K, Matsumura, H (1999) "A Novel nanoscale Metal Transistor Fabricated by Conventional Photolithography" Jpn.J.Appl-.Phys. Vol. 38, pp. 7233 7236, proposes a realization of a metal transistor in accordance with the theoretical concept described in Fujimaru et al. A fabrication method for forming a metal insulator tunnel transistor (MITT), including a metallic source region and a metallic drain region as well as an electrically insulating channel region, is described using a conventional photolithography process. A gate insulator and a gate electrode are arranged on the electrically insulating channel region arranged between the metallic source region and the metallic drain region. A tunneling current through a tunnel insulator between source and drain regions can be controlled by changing the gate voltage.

SUMMARY OF THE INVENTION

The invention is based on the problem of providing a floating gate memory cell with shortened signal propagation times which can be integrated into a substrate with an increased integration density.

The problem is solved by a floating gate memory cell, a floating gate memory arrangement, a circuit arrangement and a method for fabricating a floating gate memory cell having the features described in the independent patent claims.

In the floating gate memory cell according to the invention, the two source/drain regions and the floating gate layer are formed from a metallically conductive material, and the channel region is formed from an electrically insulating material.

The floating gate memory arrangement according to the invention includes a plurality of floating gate memory cells having the abovementioned features arranged substantially in matrix form.

In the floating gate memory arrangement, a floating gate memory cell preferably takes up an area of approximately 4 $F^2$, where F is the minimum feature size that can be achieved within the context of a technology. In particular if the memory transistor is configured as a vertical transistor, a particularly space-saving design is possible.

Furthermore, the invention provides a circuit arrangement which includes an integrated circuit, which is integrated in a semiconductor substrate and has at least one semiconductor component, and at least one floating gate memory cell having the features described above on the integrated circuit.

According to the method of the invention for fabricating a floating gate memory cell, the two source/drain regions and the floating gate layer are formed from a metallically conductive material, and the channel region is formed from an electrically insulating material.

It is preferable for the two source/drain regions and the floating gate layer of the floating gate memory cell to include a metal.

On account of the fact that the source/drain regions and the floating gate layer are produced from a metallic material, it is possible to benefit from the good electrical conductivity of a metal. If an electric current flows through the source/drain regions, only a small amount of heat is lost, on account of the good electrical conductivity and the associated low resistance losses in the metallic source/drain regions. It should be pointed out that in the case of a miniaturized circuit the formation of waste heat represents one of the main problems. Furthermore, the read time of the floating gate memory cell is reduced compared to the prior art, since charge carriers in a metallic material have a shorter Fermi wavelength than in a semiconductor. Therefore, the access times of the floating gate memory cell according to the invention are reduced.

The floating gate memory cell according to the invention preferably includes a first layer, in which the two source/drain regions and the channel region arranged between them are arranged next to one another, and a first dielectric layer on the first layer: the floating gate layer is applied to the first dielectric layer, and a second dielectric layer is applied to the floating gate layer. Furthermore, a control gate electrode layer is applied to the second dielectric layer.

According to a preferred configuration of the invention, the first layer is arranged on a substrate.

This configuration evidently corresponds to the floating gate memory cell being formed as a planar transistor, i.e. to different layers being deposited on one another and patterned substantially in parallel.

Alternatively, in the floating gate memory cell according to the invention, the layer sequence formed from the first layer, the first dielectric layer, the floating gate layer, the second dielectric layer and the control gate electrode layer can be arranged on a substrate in such a manner that the lateral edge sections of the layers of the layer sequence are arranged on the surface (or substantially parallel to the surface) of the substrate. The direction in which the layers are stacked on one another runs substantially parallel to that main surface plane of the substrate on which the layers are formed.

According to this configuration, the floating gate memory cell is realized as a vertical transistor memory cell, i.e. as a floating gate memory cell, in which the flow of electric current through the channel region takes place substantially orthogonally with respect to the main surface of the substrate. A vertical transistor allows an increased integration density to be achieved, since even with increasing miniaturization (i.e. reduction in the space taken up by a component on the substrate surface) the channel region (running in the orthogonal direction with respect to the substrate surface) can remain of sufficient size to avoid disruptive short-channel effects. Therefore, the vertical configuration of the floating gate memory cell according to the invention results in an increased integration density combined at the same time with a sufficient channel length.

The layer sequence may preferably furthermore include an additional first dielectric layer on that main surface of the first layer which is devoid of the first dielectric layer, an additional floating gate layer on the additional first dielectric layer, an additional second dielectric layer on the additional floating gate layer, and an additional control gate electrode layer on the additional second dielectric layer, the control gate electrode layer and the additional control gate electrode layer being coupled.

If the floating gate memory cell is configured as a vertical transistor in accordance with the refinement described, the result is a symmetrical arrangement.

In particular, with the floating gate memory cell according to the invention, the substrate may be made from an electrically insulating material, in particular from silicon dioxide material.

In the floating gate memory cell according to the invention, the two source/drain regions, the floating gate layer and the control gate electrode layer may, independently of one another, include one or a combination of the materials aluminum, titanium, titanium nitride (TiN), copper and tungsten. The channel region may include one or a combination of the materials amorphous silicon (in particular in undoped form), tantalum oxide ($Ta_2O_5$), titanium oxide ($TiO_2$), hafnium oxide ($HfO_2$) and zirconium oxide ($ZrO_2$). The first dielectric layer and the second dielectric layer may, independently of one another, include one or a combination of the materials silicon nitride ($Si_3N_4$), silicon dioxide ($SiO_2$), aluminum oxide ($Al_2O_3$) and lanthanum oxide ($La_2O_3$). The said materials are given purely by way of example and do not represent an exhaustive list.

It should be noted that the barrier level between the metallic source/drain connections, on the one hand, and the electrically insulating channel layer, on the other hand, is preferably between 0.5 eV (electron volt) and 1 eV. In the case of operation at room temperature, for example, a barrier level of 0.6 eV is a suitable selection. A particularly favorable combination of materials is achieved if the two source/drain regions are made from aluminum material and the channel region is made from tantalum oxide ($Ta_2O_5$) or if the two source/drain regions are made from titanium and the channel region is made from titanium oxide ($TiO_2$). In this configuration, the barrier level between source/drain connections and the channel region is in each case at an appropriate value.

Furthermore, the invention provides a circuit arrangement. This circuit arrangement has a circuit which is integrated in a semiconductor substrate and has at least one semiconductor component, and has at least one floating gate memory cell with the above-described features on the integrated circuit.

The floating gate memory cell of the invention may evidently be formed preferably in the "back end" region of a product with an integrated circuit. In the production of an integrated semiconductor circuit, it is often the case that the semiconductor components are firstly integrated in a semiconductor substrate before final production of a metallization level above the integrated semiconductor components. During final semiconductor manufacture (i.e. in the "back end" region), metallization processing is carried out, and the floating gate memory cell according to the invention made from metallic materials can additionally be formed during a "back end" process of this type on, i.e. in an overlying level of, a semiconductor memory arrangement which already exists, for example. According to one possible configuration, first of all a memory arrangement and a logic region are formed in a silicon substrate, and then an additional memory arrangement with floating gate memory cells in accordance with the invention can be formed in a metallization level processed above the semiconductor level. This makes it possible to combine a plurality of levels of memory arrangements formed above one another and thereby to increase the integration density of memory cells in a substrate, i.e. the number of memory cells per unit area of the substrate.

A further advantage of the invention is to be considered as residing in the fact that surface sections which are not required in a metallization level formed above a processed semiconductor can be put to good use by, for example, an additional memory arrangement with floating gate memory cells in accordance with the invention being formed there. This means that the invention can particularly advantageously be used in the "back end", i.e. in the wiring level on the chip which has in itself already been fully processed.

The following text provides a more detailed description of the method according to the invention for fabricating a floating gate memory cell. Configurations of the floating gate memory cell also apply to the method for fabricating the floating gate memory cell.

According to an advantageous refinement of the method described above for fabricating a floating gate memory cell, a first layer is formed on a substrate by the two source/drain regions and the channel region arranged between them being formed next to one another, by a first dielectric layer being formed on the first layer, by the floating gate layer being formed on the first dielectric layer, by a second dielectric layer being formed on the floating gate layer, and by a control gate electrode layer being formed on the second dielectric layer.

According to an alternative configuration, the first source/drain region may be formed on a surface region of a substrate, the channel region may be formed on the first source/drain region, the second source/drain region may be formed on the channel region, a first dielectric layer may be formed on the layer sequence formed by the first source/drain region, the channel region and the second source/drain region, a floating gate layer may be formed at least in part on side wall regions of the first dielectric layer, a second dielectric layer may be formed on the floating gate layer and on at least a partial region of the uncovered surface of the first dielectric layer, and a control gate electrode layer may be formed on the second dielectric layer.

The method steps described can all be realized using standard, tried-and-tested processes, making it possible to achieve low process costs. Moreover, the method steps are "back end"-compatible, i.e. are suitable for use with method steps as employed for wiring on the chip in the "back end".

With the metal-insulator-metal floating gate transistor according to the invention, it is possible to achieve a sufficiently high current density (for example $10^6 A/cm^2$ to $10^8 A/cm^2$). A storage density of $4F^2$ per floating gate memory cell can be achieved. In this context, F denotes the minimum feature size which can be achieved in the context of a technology generation. It is possible to increase the integration density still further by using three-dimensional integration, i.e. by arranging a plurality of layers comprising memory cells above one another. The arrangement described in FIG. 3 is significantly simpler than conventional high-density floating gate arrays with uniform channel programming (e.g. NAND). This is in particular because the source and bit lines of a cell are used only for this cell and its vertical neighbors. This is a crucial advantage. The procedure used to form the floating gate memory cell according to the invention is not particularly complex and is therefore inexpensive, and the use of metallic source/drain connections means that it is possible to shorten access times on account of the low electrical resistance.

BRIEF DESCRIPTION OF THE DRAWINGS

Exemplary embodiments of the invention are illustrated in the figures and explained in more detail in the text which follows. In the drawing:

FIG. 1 shows a cross-sectional view of a floating gate memory cell in accordance with a first exemplary embodiment of the invention;

FIG. 3 shows a plan view of a floating gate memory arrangement in accordance with a preferred exemplary embodiment of the invention.

DETAILED DESCRIPTION OF THE PREFERRED MODE OF THE INVENTION

Figure 2A:
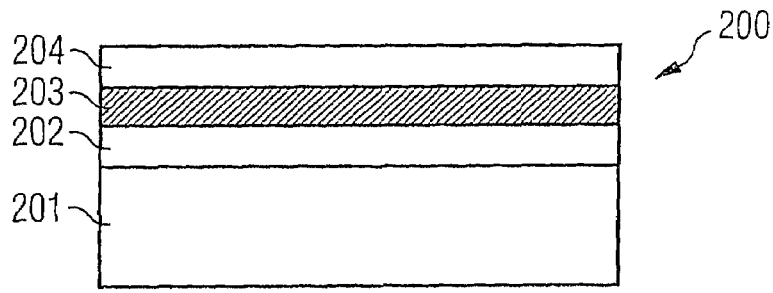
FIGS. 2A to 2D show layer sequences at different times during a method for fabricating a floating gate memory cell in accordance with a preferred exemplary embodiment of the invention.

The following text, referring to FIG. 1, describes a floating gate memory cell 100 in accordance with a first preferred exemplary embodiment of the invention.

The floating gate memory cell 100 includes a first layer, in which a first source/drain region 101 made from titanium and a second source/drain region 102 made form titanium and a channel region 103 arranged between them and made from titanium oxide are arranged next to one another, and includes a first dielectric layer 104 made from aluminum oxide on the first layer, a floating gate electrode 105 made from titanium on the first dielectric layer 104, a second dielectric layer 106 made from aluminum oxide on the floating gate layer 105 and a control gate electrode layer 107 on the second dielectric layer 106.

The first layer, comprising the first source/drain region 101, the second source/drain region 102 and the channel region 103, is arranged on a silicon dioxide substrate 108. In other words, the floating gate memory cell 100 is formed as a planar floating gate memory cell in which a flow of electric current through the channel region 103 runs parallel to the main surface of the silicon dioxide substrate 108, i.e. in a horizontal direction in accordance with FIG. 1. The two source/drain regions 101, 102 and the floating gate layer 105 are made from a metal, specifically from titanium, and the channel region 103 is made from titanium oxide, i.e. from an electrically insulating material.

The following text describes the functionality of the floating gate memory cell 100.

To write an item of information to the floating gate memory cell 100, the first source/drain region 101 is brought to a sufficiently high electrical potential (for example 15 V), whereas the control gate electrode layer 107 is at an electrical potential of 0 V. On account of these potential ratios, it is possible for electrical charge carriers to tunnel between the first source/drain region 101 and the floating gate layer 105 (Fowler-Nordheim tunneling). After the voltage applied to the first source/drain region 101 has been switched off, therefore, uncompensated charge carriers remain in the floating gate layer 105. By applying a low voltage between the first source/drain region 101 and the second source/drain region 102, it is possible to determine whether the floating gate layer 105 does (for example logic value "1") or does not (logic value "0") permanently contain electrical charge carriers. The floating gate layer 105 is checked to determine whether or not it contains charge carriers, for example by the application of a fixed voltage between the two source/drain regions 101, 102, with the strength of current flowing being dependent on the electrical resistance of the channel region 103, which is in turn influenced by whether or not the floating gate layer 105 contains electrical charge carriers.

FIG. 1 includes a number of characteristic dimensions of the floating gate memory cell 100. The vertical thickness of the source/drain regions 101, 102 and of the channel region 103 is $l_1$=5 nm. The lateral extent of the channel region 103 is $l_2$=15 nm. As shown in FIG. 1, the cross section of the channel region 103 is rectangular. Alternatively, the cross section of the channel region 103 may also, for example, be trapezoidal, such that the lateral extent of the channel region 103 is shorter at the interface with the silicon dioxide substrate 108 than the lateral extent of the channel region 103 at the interface with the first dielectric layer 104. The vertical thickness of the first dielectric layer 104 may, for example, be $l_3$=2 nm. The lateral dimension of the layers 104, 105, 106, 107 in accordance with FIG. 1 is, for example, $l_4$=20 nm.

The following text, referring to FIG. 2A to FIG. 2E, describes a preferred exemplary embodiment of the method according to the invention for fabricating a floating gate memory cell.

To obtain the layer sequence 200 shown in FIG. 2A, a first aluminum layer 202 is deposited on a silicon dioxide substrate 201, a tantalum oxide layer ($Ta_2O_5$) 203 is deposited on the first aluminum layer 202, and a second aluminum layer 204 is deposited on the tantalum oxide layer 202. The deposition processes can be carried out using the CVD (Chemical Vapor Deposition) process or the ALD (Atomic Layer Deposition) process. It is particularly advantageous for the tantalum oxide layer 203, which is subsequently used as the channel region, to be formed using the ALD process, since the ALD process can be used to set the layer thickness to an accuracy of one atomic layer, i.e. to an accuracy of just a few angstroms. This is important for the functionality of a floating gate memory cell, since in this deposition process the channel length, which is a crucial parameter for the functionality of a field-effect transistor, is defined.

Figure 2B:
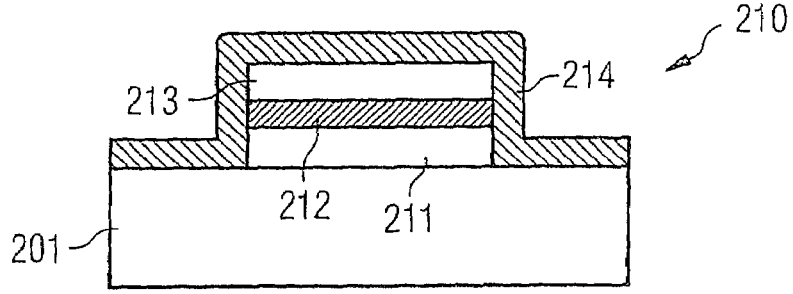

To obtain the layer sequence 210 shown in FIG. 2B, the first aluminum layer 202, the tantalum oxide layer 203 and the second aluminum layer 204 are each laterally patterned on both sides, so as to form the first source/drain region 211, the channel region 212 and the second source/drain region 213. The patterning is carried out using a lithography process and an etching process. In accordance with the method steps which have been described hitherto, the first source/drain region 211 is formed on a surface region of the silicon substrate 201, the channel region 212 is formed on the first source/drain region 211, and the second source/drain region 213 is formed on the channel region 212. Furthermore, to obtain the layer sequence 210 shown in FIG. 2B, a first aluminum oxide layer 214 is formed on the surface of the layer sequence, in particular on the second source/drain region 213 and on the uncovered surface of the silicon dioxide substrate 201. Furthermore, it should be noted that the first aluminum oxide layer 214 is also deposited on the uncovered side faces of the first source/drain region 211 and of the channel region 212. The first aluminum oxide layer 214 is deposited using the ALD process, which makes it possible to accurately set the thickness of a layer or a layer sequence.

Figure 2C:
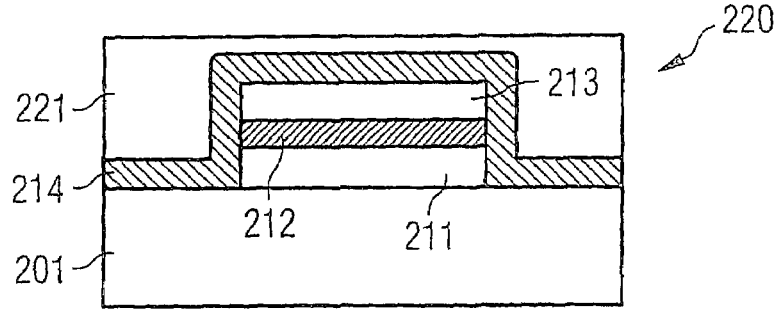

To obtain the layer sequence 220 shown in FIG. 2C, a third aluminum layer 221 is deposited on the surface of the layer sequence 220. This can be effected, for example, using a CVD process.

Figure 2D:
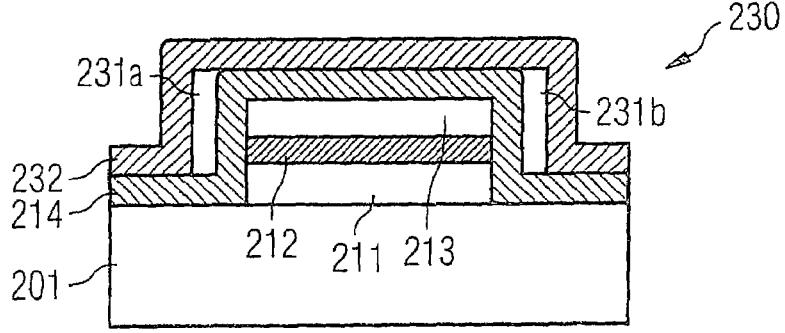

To obtain the layer sequence 230 shown in FIG. 2D, the third aluminum layer 221 is patterned using a lithography process and a spacer etching process, in such a manner that the floating gate layer is produced as a result, this floating gate layer including a first floating gate partial layer 231a and a second floating gate partial layer 231b. After the steps described have been carried out, the floating gate layer comprising the first floating gate partial layer 231a and the second floating gate partial layer 231b has been formed on side wall regions of the first aluminum oxide layer 214. Furthermore, a second aluminum oxide layer 232 is formed on the floating gate layer 231a, 231b and on the uncovered surface of the first aluminum oxide layer 214.

Figure 2E:
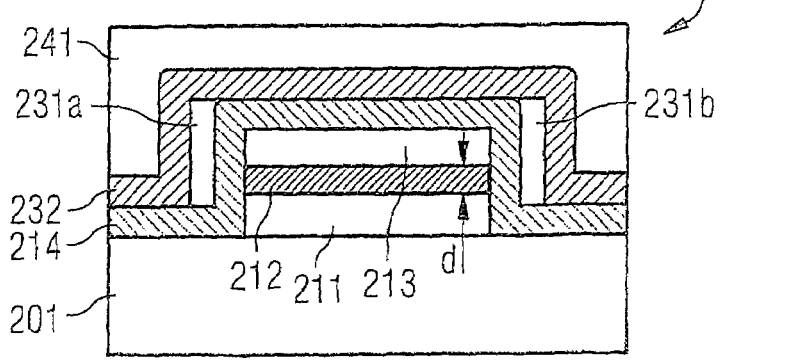
FIG. 2E shows a floating gate memory cell fabricated using the preferred exemplary embodiment of the method for fabricating a floating gate memory cell, in accordance with a second exemplary embodiment of the invention.

To obtain the floating gate memory cell 240 in accordance with a second exemplary embodiment of the invention shown in FIG. 2E, a fourth aluminum layer 241 is formed as a control gate electrode layer on the second aluminum oxide layer 232. According to the exemplary embodiment described, this is carried out using a CVD process. The fourth aluminum layer 232 is patterned so as to form a word line.

The floating gate memory cell 240 is configured as a vertical transistor arrangement, since the flow of current between the source/drain regions 211, 213 through the channel region 212 takes place in an orthogonal direction, i.e. a vertical direction in FIG. 2E, with respect to the main surface of the silicon dioxide substrate 201.

The thickness d of the channel region 212 is approximately 5nm, so that it is possible to obtain a desired current density of approximately $10^6 A/cm^2$ to $10^8 A/cm^2$ with the configuration of materials described. According to the constellation described, the barrier level between the source/drain regions 211, 213, on the one hand, and the channel region 212, on the other hand, is approximately between 0.5 eV and 1 eV.

The fourth aluminum layer 241 fulfills the functionality of a control gate electrode (and optionally a word line of a floating gate memory cell arrangement), the floating gate partial layers 231a, 231b fulfill the functionality of a floating gate, so that charge carriers contained in the floating gate partial layers 231a, 231b have a characteristic influence on the electrical conductivity of the channel region in its region of interface with the first aluminum oxide layer 214. The first aluminum oxide layer 214 evidently functions as a tunneling layer, i.e. electrical charge carriers can flow between the source/drain regions 211 or 213, on the one hand, and the floating gate partial layers 231a, 231b, on the other hand, by means of Fowler-Nordheim tunneling by means of suitable electrical potentials being applied to the respective connections of the floating gate memory cell (cf. description in connection with FIG. 1). Alternatively, the floating gate can also be charged via the word line. The information to be stored in the floating gate memory cell 241 is coded in the quantity of charge carriers introduced into the floating gate partial layers 231a, 231b in this way. This information can be read by determining the flow of electric current between the two source/drain regions 211, 213 by the application of a predetermined voltage between the source/drain regions 211, 213. On account of the fact that the electrical conductivity of the channel region 212 is dependent on the quantity of charge carriers contained in the floating gate partial layers 231a, 231b, this flow of current is a characteristic indicator of the information which is programmed in. The first aluminum oxide layer 214 and the second aluminum oxide layer 232 are designed to be sufficiently thick to, in the absence of a programming voltage, prevent the charge quantity stored in the first floating gate partial layer 231a, and the second floating gate partial layer 231b from flowing away.

The following text, with reference to FIG. 3, describes a preferred exemplary embodiment of a floating gate memory arrangement 300.

The floating gate memory arrangement 300 has a multiplicity of floating gate memory cells 240, as shown in FIG. 2E, arranged substantially in matrix form. However, only four floating gate memory cells 240 are shown in FIG. 3, in order to provide a simplified illustration for explaining the arrangement 300. It should be noted that the illustration presented in FIG. 3 represents a plan view of the arrangement of floating gate memory cells 240 arranged substantially in matrix form, in which, however, elements which are in some cases located at lower levels and are inherently covered (for example the floating gate partial layers 231a, 231b) are visible in order to enhance the clarity of illustration.

As shown in FIG. 3, a floating gate memory cell 240 is arranged in each crossover region of a patterned fourth aluminum layer 241, formed as a word line, and a respective "bit line" 301. Each "bit line" 301 includes two lines, a source and a bit line, which are each coupled to source and drain of the associated floating gate memory cell (this corresponds to the contacts 211 and 213 from FIG. 2E). Each word line 241 is coupled to the control gate electrode of the respective floating gate memory cell 240. In this way, it is very easy to achieve a storage density of $4F^2$ with rapid access to any individual cell. This arrangement is therefore far superior to a NAND structure in terms of access time and complexity.

The invention claimed is:

1. A floating gate memory cell, comprising:
   a first layer having a first and second source/drain regions and a channel region arranged between and next to the first and second source/drain regions; and
   a floating gate layer arranged on the first layer,
   wherein the first and second source/drain regions and the floating gate layer are formed of a metallically conductive material, and the channel region is formed of an electrically insulating material, and
   wherein the substrate is made from silicon dioxide.

2. The floating gate memory cell of claim 1, wherein the first and second source/drain regions and the floating gate layer include a metal.

3. The floating gate memory cell of claim 1, further comprising:
   a first dielectric layer arranged between the first layer and the floating gate layer;
   a second dielectric layer arranged on the floating gate layer; and
   a control gate electrode layer arranged on the second dielectric layer.

4. The floating gate memory cell of claim 3, wherein the substrate is made from an electrically insulating material.

5. The floating gate memory cell of claim 3 formed as a planar floating gate memory cell wherein electric current flows through the channel region parallel to the surface of the substrate.

6. The floating gate memory cell of claim 3, wherein, independently of one another, the first and second source/drain regions, the floating gate layer, and the control gate electrode layer include one or a combination of materials selected from the group consisting of aluminum, titanium, titanium nitride, copper, and tungsten.

7. The floating gate memory cell of claim 3, wherein, independently of one another, the first dielectric layer and the second dielectric layer include one or a combination of the materials selected from the group consisting of aluminum oxide, silicon nitride, silicon dioxide, and lanthanum oxide.

8. The floating gate memory cell of claim 1, wherein the channel region includes one or a combination of the materials selected from the group consisting of tantalum oxide, titanium oxide, hafnium oxide, undoped amorphous silicon, and zirconium oxide.

9. The floating gate memory cell of claim 1, wherein the barrier level between the first and second source/drain regions and the channel region is between 0.5 eV and 1 eV.

10. A floating gate memory cell comprising:
    a first layer having a first and second source/drain regions and a channel region arranged between and next to the first and second source/drain regions; and
    a floating gate layer arranged on the first layer,
    wherein the first and second source/drain regions and the floating gate layer are formed of a metallically conductive material, and the channel region is formed of an electrically insulating material, and
    wherein the first and second source/drain regions are made from aluminum and the channel region is made from tantalum oxide, or wherein the first and second source/drain regions are made from titanium and the channel region is made from titanium oxide.

11. A floating gate memory arrangement having a plurality of floating gate memory cells arranged substantially in matrix form, wherein each memory cell comprises:
    a first layer having a first and second source/drain regions and a channel region arranged between and next to the first and second source/drain regions; and
    a floating ante layer arranged on the first layer,
    wherein the first and second source/drain regions and the floating gate layer are formed of a metallically conductive material, and the channel region is formed of an electrically insulating material, and
    wherein an area required for a floating gate memory cell is approximately $4 F^2$, where F is a minimum feature size that is achieved in a context of a particular technology.

12. A circuit arrangement, comprising:
    a circuit which is integrated in a semiconductor substrate and has at least one semiconductor component; and at least one floating gate memory cell as claimed in claim 1 arranged on the integrated circuit.

13. A floating gate memory cell, comprising:

a substrate;

a layer sequence formed on the substrate and having a first source/drain region, a channel region arranged on the first source/drain region, and a second source/drain region arranged on the channel region, wherein the first and second source/drain regions are formed of a metallically conductive material, and the channel region is formed of an electrically insulating material;

a first dielectric layer arranged on the surface and side wall regions of the layer sequence and on a portion of the substrate surface that is devoid of the layer sequence;

a floating gate layer arranged on side wall regions of the first dielectric layer, wherein the floating gate layer is formed of a metallically conductive material;

a second dielectric layer arranged on uncovered surfaces of the first dielectric layer and on the floating gate layer; and a control gate electrode layer arranged on the second dielectric layer, wherein lateral edge sections of the first and second dielectric layers are arranged on the surface of the substrate.

14. The floating gate memory cell of claim 13, wherein the first and second source/drain regions and the floating gate layer include a metal.

15. The floating gate memory cell of claim 14, wherein the substrate is made from silicon dioxide.

16. The floating gate memory cell of claim 13, wherein the substrate is made from an electrically insulating material.

17. The floating gate memory cell of claim 13, wherein, independently of one another, the first and second source/drain regions, the floating gate layer, and the control gate electrode layer include one or a combination of materials selected from the group consisting of aluminum, titanium, titanium nitride, copper, and tungsten.

18. The floating gate memory cell of claim 13, wherein the channel region includes one or a combination of the materials selected from the group consisting of tantalum oxide, titanium oxide, hafnium oxide, amorphous silicon, and zirconium oxide.

19. The floating gate memory cell of claim 13, wherein, independently of one another, the first dielectric layer and the second dielectric layer include one or a combination of the materials selected from the group consisting of aluminum oxide, silicon nitride, silicon dioxide, and lanthanum oxide.

20. The floating gate memory cell of claim 13, wherein the first and second source/drain regions are made from aluminum and the channel region is made from tantalum oxide, or wherein the first and second source/drain regions are made from titanium and the channel region is made from titanium oxide.

21. The floating gate memory cell of claim 13 configured as a vertical transistor arrangement, wherein electric current between the first and second source/drain regions through the channel region flows in an orthogonal direction with respect to the surface of the substrate.

22. A floating gate memory arrangement having a plurality of floating gate memory cells as claimed in claim 13 arranged substantially in matrix form.

23. The floating gate memory arrangement of claim 22, wherein an area required for a floating gate memory cell is approximately 4 $F^2$, where F is a minimum feature size that is achieved in a context of a particular technology.

24. A circuit arrangement, comprising:

a circuit having at least one semiconductor component; and at least one floating gate memory cell as claimed in claim 13 on the integrated circuit.

* * * * *

UNITED STATES PATENT AND TRADEMARK OFFICE
CERTIFICATE OF CORRECTION

| | |
|---|---|
| PATENT NO. | : 7,385,243 B2 |
| APPLICATION NO. | : 10/926838 |
| DATED | : June 10, 2008 |
| INVENTOR(S) | : Andrew Graham et al. |

Page 1 of 1

It is certified that error appears in the above-identified patent and that said Letters Patent is hereby corrected as shown below:

Column 10:

In Claim 10, line 35, "cell" should read --cell,--

In Claim 11, line 56, "ante" should read --gate--

Signed and Sealed this

Sixteenth Day of September, 2008

JON W. DUDAS
*Director of the United States Patent and Trademark Office*